United States Patent [19]

Avanzino et al.

[11] Patent Number: 5,691,573
[45] Date of Patent: Nov. 25, 1997

[54] COMPOSITE INSULATION WITH A DIELECTRIC CONSTANT OF LESS THAN 3 IN A NARROW SPACE SEPARATING CONDUCTIVE LINES

[75] Inventors: Steven Avanzino, Cupertino; Darrell M. Erb, Los Altos; Robin Cheung, Cupertino; Rich Klein, Mountain View, all of Calif.

[73] Assignee: Advanced Micro Devices, Inc., Sunnyvale, Calif.

[21] Appl. No.: 481,030

[22] Filed: Jun. 7, 1995

[51] Int. Cl.$^6$ ........................ H01L 23/485; H01L 23/52
[52] U.S. Cl. .................... 257/758; 257/752; 257/642; 257/643
[58] Field of Search ........................... 257/758, 642, 257/643, 752

[56] References Cited

U.S. PATENT DOCUMENTS

| | | | |
|---|---|---|---|
| 5,004,704 | 4/1991 | Maeda et al. | 432/195 |
| 5,124,014 | 6/1992 | Foo et al. | 204/5 |
| 5,275,977 | 1/1994 | Otsubo et al. | 437/235 |
| 5,278,103 | 1/1994 | Mallon et al. | 437/240 |
| 5,432,128 | 7/1995 | Tsu | 437/194 |
| 5,451,804 | 9/1995 | Lur et al. | 257/758 |
| 5,530,293 | 6/1996 | Cohen et al. | 257/5 |
| 5,566,045 | 10/1996 | Summerfelt et al. | 437/52 |

*Primary Examiner*—Tom Thomas
*Assistant Examiner*—Alexander Oscar Williams
*Attorney, Agent, or Firm*—Foley & Lardner

[57] ABSTRACT

A method of forming low dielectric insulation between those pairs of conductive lines, of a level of interconnection for integrated circuits, having a gap of about 0.5 microns or less by depositing a nonconformal source with a poor step function for the insulating material, such as silane ($SiH_4$) as the silicon (Si) source for silicon dioxide ($SiO_2$), so as to create, in the gap, a large void whose dielectric constant is slightly greater than 1. After all of the conductive lines have received a deposit of conformal insulating material and a flowable insulating material, the composite insulating materials are removed, preferably by etching, from those pairs of conductive lines with a gap of about 0.5 microns or less. Now, a nonconformal insulating material with a poor step function is deposited and creates a large void in the open gaps of 0.5 microns or less. After creating the void, the deposition continues and is planarized at the desired composite thickness of insulation. Alternatively, a thin conformal insulating layer is first deposited as a liner on the conductive lines. The resulting structure of the interconnection level comprises a layer of insulation between and on the conductive lines with the dielectric constant of the insulation between the pairs of conductive lines with the gap of 0.5 or less being, in combination with the void, at least about 3 or lower, and all of the remaining gaps are filled with the flowable insulating material and are void free with a composite dielectric constant of greater than about 3.5.

14 Claims, 4 Drawing Sheets

COMPOSITE INSULATION WITH A DIELECTRIC CONSTANT OF LESS THAN 3 IN A NARROW SPACE SEPARATING CONDUCTIVE LINES

CROSS REFERENCES TO RELATED APPLICATIONS

This application is related to U.S. patent application Ser. No. 08/478,315, entitled Bias Plasma Deposition for Selective Low Dielectric Insulation, filed on an even date herewith; and U.S. patent application Ser. No. 08/481,906, entitled Uniformed Nonconformal Deposition for Forming Low Delectic Constant Insulation Between Certain Conductive Lines, also filed on an even date herewith.

BACKGROUND OF THE INVENTION

This invention relates to the fabrication of integrated circuits semiconductor devices and, more particularly, to forming an insulating layer on and between metal conductive lines which provide an interconnection between the active and/or passive elements of the integrated circuit and other levels of interconnection.

In very large scale integrated (VLSI) circuit devices, several wiring layers are required to connect together the active and/or passive elements in a VLSI semiconductor chip. The interconnection structure consists of thin conductive lines separated by insulation in one layer or level and connected through vias or studs from contacts of the elements of the semiconductor chip or to a similar layer in another level of interconnections. This interconnection structure is similar to a transmission line in that there is a propagation delay of the signals being transmitted in these wiring layers. The delay is referred to as RC delay because it is a result of the resistance (R) of the material of the wire and the capacitance (C) between adjacent wires. With the trend of higher and higher levels of integration in semiconductor devices to ultra large scale integrated (ULSI) circuits, the space or gap between the wires or conductive lines to be filled with insulation is becoming extremely narrow between some of the conductive lines, such as about 0.5 microns and smaller. Such a narrow space or gap between conductive lines increases the capacitance and places greater demands on the insulating properties of the insulation between the conductive lines. Capacitance (C) is the product of dielectric constant (DC) of the insulating material times the area (A) of the opposing faces of the conductive lines divided by the distance (D) between the conductive lines. With a decrease in distance (D) or the gap between conductive lines, the capacitance (C) increases. Since signal delay of signal transmitted on the conductive line is controlled by the RC constant, an increase in capacitance (C) degrades the performance of the integrated circuit.

At the present state of the art, the insulating material used to fill these gaps is a silicon compound, such as silicon dioxide, which has a dielectric constant (DC) of between 3.5 and 4.0. A vacuum has a perfect dielectric constant (DC) and is the basis for the measurement of the dielectric constant of materials. For example, air and other insulating gases have a dielectric constant (DC) of about 1 or slightly less than 1. The use of insulating material with dielectric constants (DC) lower than 3.5 in the narrow gap will lower the capacitance (C) and offset the increase caused by the smaller distance (D) between adjacent conductive lines. Attempts have been made to use organic insulating materials, such as polyimides which have a DC of between 3.2–3.4, but are hydroscopic and any absorbed moisture can potentially cause corrosion of metal lines.

In addition to the demands placed on the insulating property of the insulation between the conductive lines, these narrow gaps of about 0.5 microns and smaller make it much more difficult to deposit the insulating material into the gaps so that the gaps may not be completely and properly filled. In addition, when the height of the conductive line is increased, it makes it more difficult to fill, especially when the aspect ratio is 2 to 1 or greater with a gap distance of 0.5 microns or smaller. Aspect ratio is the height (h) of the conductive line divided by the distance (d) or gap between the conductive lines. It is pointed out in U.S. Pat. No. 5,124,014 to Pang-Dow Foo et al. that when the gap or distance (d) is less than the height (h) of the conductive line, it is difficult to fill uniformly. This patent states that the top tends to accumulate deposited material, growing shoulders that may eventually close off before the bottom is filled, leading to the formation of voids in the deposited material. U.S. Pat. No. 5,275,977 to Otsubo et al. confirms this problem and sets the same objective for their process as Pang-Dow Foo et al.; namely, the formation of the insulating film free of voids. This patent discloses the combination of chemical vapor deposition (CVD) and etching a silicon dioxide film ($SIO_2$) using tetraorthosilicate (TEOS) [$Si(OC_2H_5)_4$] as the source silicon gas and oxygen ($O_2$) for deposition of $SiO_2$ and carbon tetrafluoride ($CF_4$) as the etching gas. With TEOS as the source gas, the deposited $SiO_2$ films are conformal in that the deposition follows the contour of the surface on which it is being deposited. This patent also suggests the use of other source gases, one of which is silane ($SiH_4$). However, other than this suggestion, no description is given for forming an insulating layer between and on the conductive lines with $SiH_4$ as the source. The Pang-Dow Foo et al. patent describes the use of an electron cyclotron resonance (ECR) plasma reactor, which can be operated to both deposit and sputter etch either simultaneously or sequentially, to deposit high quality silicon dioxide layers which are void-free. The deposition of $SiO_2$ occurs in a vertical direction while the sputtering is angle dependent, with its highest yield being at 45°. Instead of $SiH_4$, either TEOS or tetramethycyclosiloxane (TMCTS) is used as the silicon containing source gases. Both of these source gases produce conformal films. This patent states that as the aspect ratio approaches and exceeds unity, it becomes more difficult to deposit void-free oxide. To prevent voids in the insulating layer in filling these narrow gaps, the bias potential is increased to induce a greater amount of sputter etching. Alternatively, a separate etching step may be performed.

One advantage of using ECR plasma deposition is that the substrate does not have to heated to more than 150 degrees C. Above about 400 degrees C., hillocks tend to form in the aluminum conductive lines and, if the growth is lateral, it could bridge the narrow gap between lines and create a short.

The description in the specification both of these patents describes methods for forming void-free insulating layers between the conductive lines and teaches that, from a detrimental standpoint, voids will form in the gaps between the conductive lines under certain conditions without describing the size or position of these voids.

SUMMARY OF THE INVENTION

It is an object of the present invention to provide, in conjunction with a conventional process of forming the insulating layer on and between conductive lines, a method for forming an insulating layer with an improved dielectric constant only on and between those metal conductive lines separated by a narrow gap.

Another object of the present invention is to provide a method for filling only the narrow gaps between conductive lines with an effective insulating layer that has a lower dielectric constant than the dielectric constant of the other wider gaps between the conductive lines.

In accordance with the present invention, a conventional process for depositing an insulating layer on and between conductive lines is followed by masking those conductive lines separated by a narrow gap and removing the insulation in the gap. A nonconformal silicon containing insulating layer is then deposited in the narrow gap and, due to the nonconformal step coverage, only a thin layer is coated on the vertical walls of the conductive lines on opposite sides of the narrow gaps, but a thick layer forms on the top and shoulders of these conductive lines. As the insulating material grows, it reduces the width of gap at the top of the lines until it bridges across the narrow gap and creates a void between these lines. At least one-third of the volume of the gap is filled with the void so that the effective dielectric constant of the combined insulating material and the void is at about or below 3. In nonconformal step coverage, the deposition rate is proportional to the arrival angle of reactants being deposited. Along the top horizontal surface of the conductive lines, the reactants arrive from many angles varying from 0° to 180°, while reactants at the top or shoulder of the vertical walls of the conductive lines arrive from angles varying from 0° to 90°. Further down the wall within the gap, the angle of arrival is dependent on height (H) of the wall and the width (W) or distance of the gap between conductive lines and is proportional to arctan W/H. Accordingly, with this method, the narrow gaps equal to or less than 0.5 microns and with an aspect ratio of at least 2 to 1 are formed with closed voids in the gaps with about at least one-third of the volume of the gap consisting of the void. By using silicon containing gases which form nonconformal layers, such as silane, it is possible to maximize the size of the void in the narrow gap and thereby maximize the effective dielectric constant of the resultant void and insulating material in the gap and thereby lower the capacitance and the RC delay.

However, in accordance with another aspect of the present invention, a thin conformal layer is first deposited on the conductive lines so as to augment the subsequent thin nonconformal layer on the vertical walls as a barrier against the protrusions or hillocks when the metal of the conductive lines is aluminum (Al). should be noted that the above described prior art patents fail to teach a method for forming a large closed void in each of the narrow gaps between the conductive lines. These patents further fail to recognize and even teach away from the performance advantage that can be gained by such a large void in a narrow gap.

BRIEF DESCRIPTION OF THE DRAWINGS

The foregoing and other objects, aspects and advantages will be better understood from the following detailed description of a preferred embodiments of the invention with reference in the drawings, in which.

DETAILED DESCRIPTION OF THE PREFERRED EMBODIMENTS OF THE INVENTION

Figure 1:
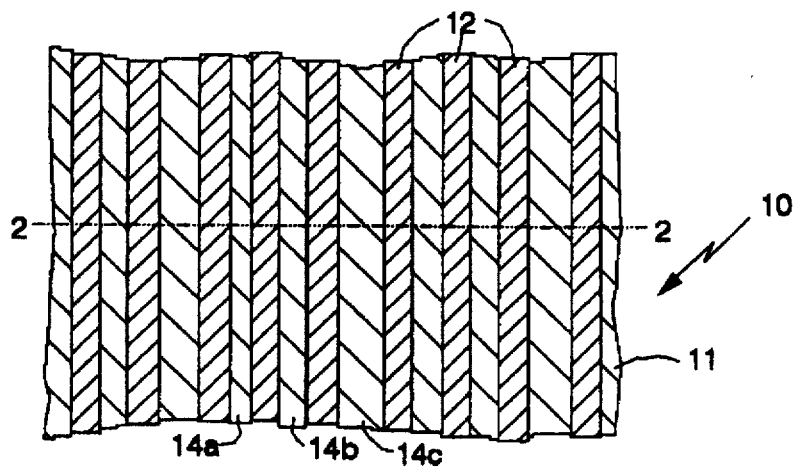
FIG. 1 is a plan view of a portion of a VLSI integrated circuit metallization layer during fabrication of a semiconductor chip prior to being covered with a layer of insulating material.
Figure 2:
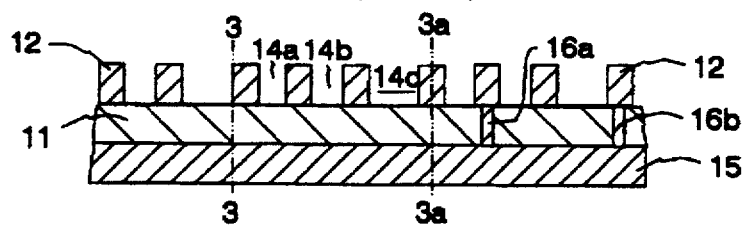
FIG. 2 is a cross-sectional view of the metallization layer taken along 2—2 of FIG. 1.
Figure 3:
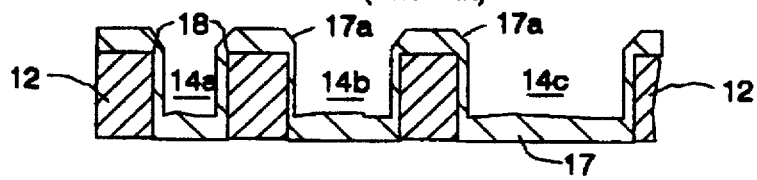
FIGS. 3, 4 and FIG. 5 are enlarged cross-sectional views of a section of FIG. 2 as indicated by vertical lines 3—3 and 3a—3a showing early, intermediate and final stages of a prior art method for coating an insulating layer on the metallization layer.
Figure 4:
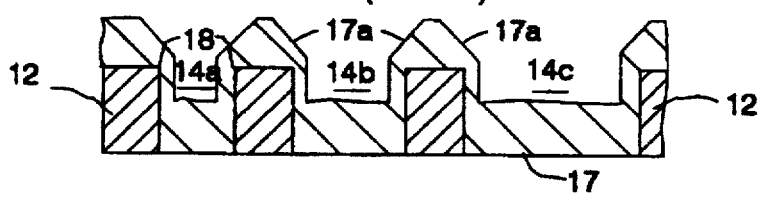
Figure 5:
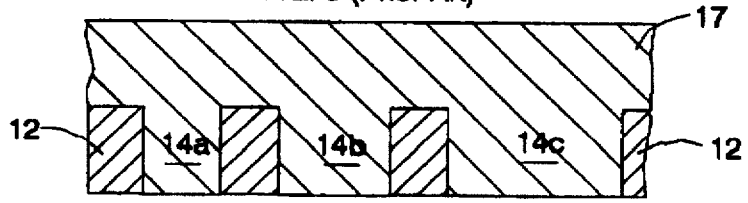

Referring now to the drawings and, more particularly, to FIGS. 1 and 2, a portion of a partially complete metallization layer 10 is shown disposed on an insulating layer 11 and with a plurality of conductive lines 12 having narrow gaps or openings 14a, intermediate gaps 14b and wide gaps 14c between the conductive lines. A cross-section of this metallization layer 10 is shown in FIG. 2 and it includes a conductive line 15 in the underlying metallization layer with vias 16a and 16b connecting that conductive line with two of the lines of the metallization layer 10. An insulating material must be deposited in the gaps or openings 14 as shown in FIGS. 1 and 2 to complete the metallization layer 10. Heretofore, this was accomplished by chemical vapor deposition (CVD) of precursors of the insulating material, such as silane ($SiH_4$) and oxygen ($O_2$). Because of smaller gaps, such as 0.5 microns or less, between the conductive lines 12 and the possible formation of a small voids in filling such narrow gaps, a present method uses the combination of simultaneously depositing and etching the insulating material to fill all of the gaps without any small voids. This method is shown in FIGS. 3, 4 and 5 at early, intermediate, and near final stages of filling the gaps 14a, 14b and 14c, respectively, between conductive lines 12 with a conformal insulating material 16, such as when the source of silicon is tetraethylorthosilicate (TEOS) or tetramethylcyclotetrasilane (TMCTS) to react with $O_2$. Either a single chamber plasma reactor or a dual chamber, such as a Electron Cyclotron Resonance (ECR) reactor, are used to simultaneously deposit $SiO_2$ and etch the deposited $SiO_2$ with either $O_2$ or Argon (Ar) providing ions for sputter etching or an etching gas, such as carbon tetrafluoride ($CF_4$) for chemical etching. In the prior method using an ECR reactor, a conformal $SiO_2$ layer is deposited anisotropically or unidirectionally parallel to the sidewalls of the conductive lines 12 so as to minimize any buildup of the deposited $SiO_2$ on the shoulders 17 of the conductive lines as best shown in FIGS. 3. In addition, the deposited $SiO_2$ is etched at approximately a 45° angle during deposition, which causes the shoulders 17 to take on a sloped appearance as shown in FIGS. 3–5 and further reduces any possibility of deposited $SiO_2$ bridging over the gaps or openings 14a, 14b and 14c to create a void. Thus, the combination of conformal source material for the insulating layer, undirectional deposition, and angle etching provides void free insulation between and on top of the conductive lines 12. The dielectric constant of the insulation between the conductive lives is the sole dielectric constant of the deposited insulating material and, since it is $SiO_2$, the dielectric constant of the prior art insulating material range of he narrow gap 14a is in the range of 3.5 to 4.

In accordance with the present invention, it has been discovered that a large void is not detrimental in filling a narrow gap or opening 14a because the void has a lower dielectric constant than any of the solid inorganic insulating materials, such as $SiO_2$, or even organic insulating materials, such as polyimide. The combination of the solid insulating material and a void of the proper size and position yields a dielectric constant of at least about 3 and lower. The void in a gap or opening of 0.5 microns or less with an aspect ratio of 2 to 1 or greater relative to the conductive line's height provides a substantial improvement in the capacitance of the gap and thereby the RC delay of the conductive lines 12a and 12b on either side of the gap 14a.

Figure 6:
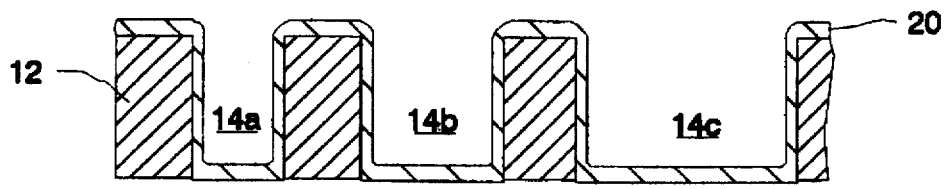
FIGS. 6, 7, 8, 9, 10, 11, 12, and 13, are enlarged cross-sectional views of the same section of FIG. 2 as in FIG. 3 showing early, intermediate and final stages of the method of the present invention for coating insulating material on the metallization layer.
Figure 7:
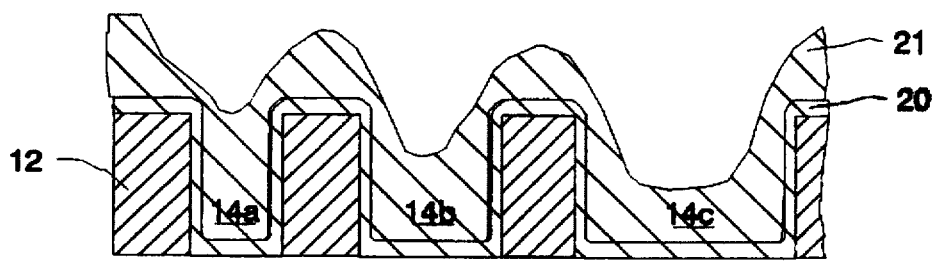
Figure 8:
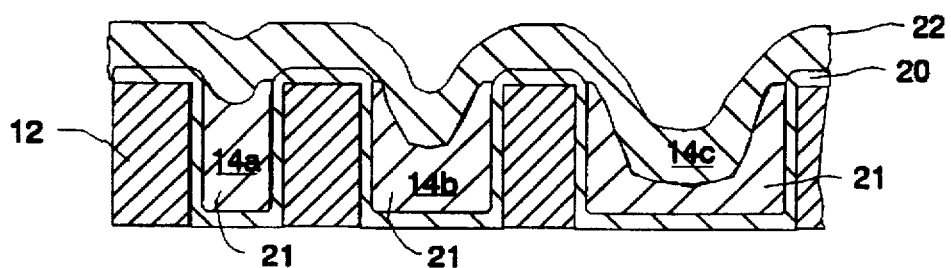

A method for achieving a void of the proper size and position in only the narrow gaps is shown sequentially in FIGS. 6, 7, 8, 9, 10, 11, 12, 13 and 14. A conventional process of forming an insulating layer on and between the conductive lines 12 carried on a substrate (not shown) starts with a CVD deposition of a conformal insulating layer 20 of at least about 1000 Å as shown in FIG. 6. The source for this conformal layer, herein silicon dioxide, is a silicon containing gas, herein TEOS, and is deposited on the conductive lines in a commerically-available multi-station parallel plate reactor. After the deposition of the conformal layer 20, the substrate carrying the conductive lines with the conformal insulating layer 20 is removed from the reactor and coated with a spin on glass (SOG) 21. Although either siloxanes or silicates mixed in a solvent may be used, such as alcohol, siloxanes are preferred and herein methylsiloxane is used to fill gaps 14a, 14b and 14c as shown in FIG. 7. This is followed, as shown in FIG. 8, by a deposition of another layer of insulating material 22, herein plasma enhanced $SiO_2$ with TEOS as the source. The same parallel plate reactor is used for the deposition.

Figure 9:
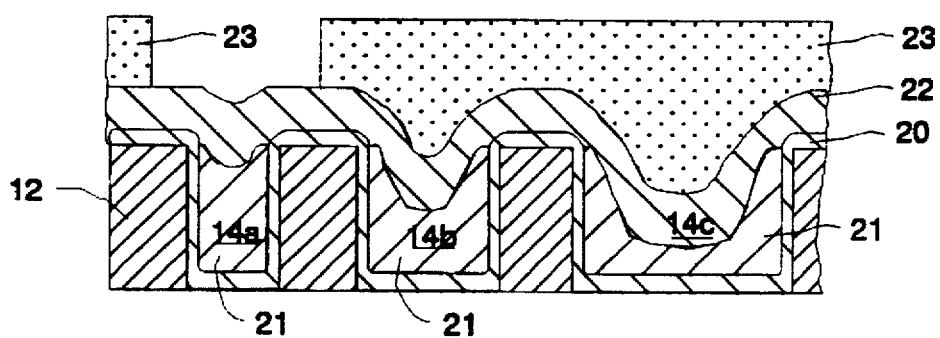
Figure 10:
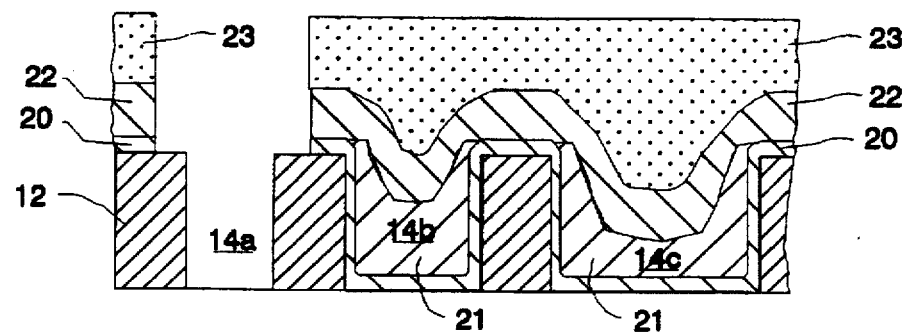
Figure 11:
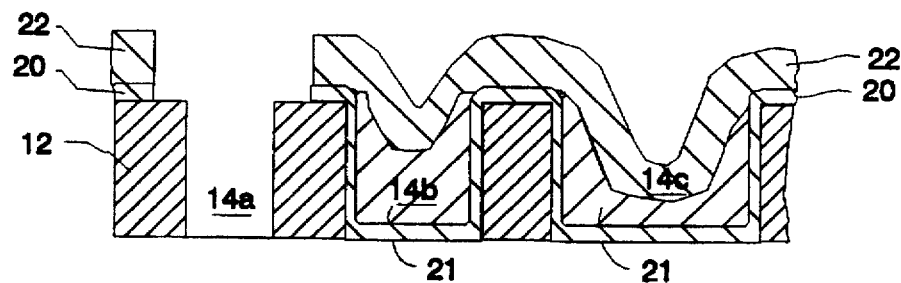

With the narrow gaps 14a between conductive lines having been predetermined, a layer of positive photoresist 23 is applied to the surface of conformal layer and exposed to a mask pattern (not shown) of the areas of narrow gaps and developed to create openings over the narrow gaps, such as 14a between conductive lines 12a and 12b, as shown in FIG. 9. Using the photoresist as an etch mask, the two insulating layers 20 and 22 and the SOG 21 are chemically etched away in a plasma reactor using herein carbon tetrafluoride, containing fluorine ions, as the etchant to leave the narrow gaps 14a unfilled with insulating as shown in FIG. 10. Preferably, the etching is anisotropic. The photoresist 23 is removed by ashing using herein $O_2$ as shown in FIG. 11.

Figure 12:
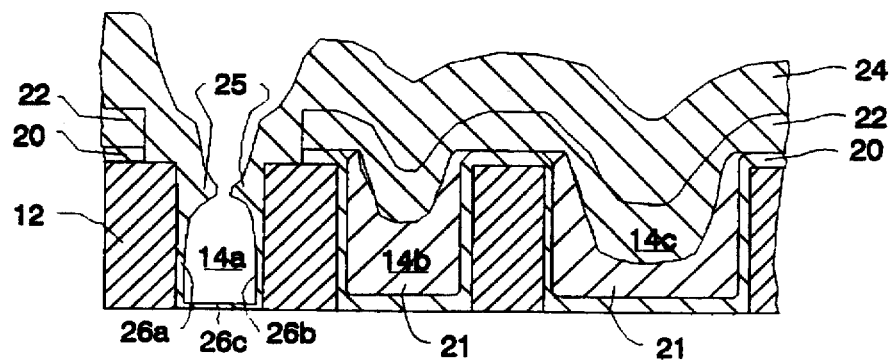
Figure 13:
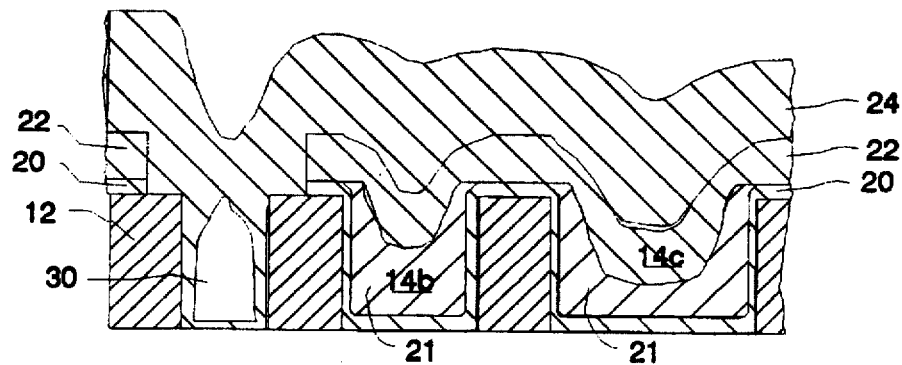

Now in accordance with the present invention, a nonconformal insulating layer 24 is deposited. The source for the insulating material, herein $SiO_2$, is silane ($SiH_4$) as the source for Si, with a source for oxygen, such as $O_2$ or $N_2O$, and herein is $SiH_4$ and $N_2O$. The use of a nonconformal source material results in poor "step coverage". Step coverage, a measure of how well a film maintains its nominal thickness, is expressed by the ratio of the minimum thickness of a film as it crosses a step, $t_r$, to the nominal thickness of the film on horizontal regions, $t_n$, and it is expressed as the percentage of the nominal thickness that occurs at the step: Step coverage (%)=$(t_r/t_n)\times100$ With a step coverage of less than 50%, the deposited $SiO_2$ forms a thick layer or shoulders 25 on top of conductive lines 12 but only forms thin sidewalls 26a, 26b and a thin bottom layer 26c in the narrow gap or opening 14a, as shown in FIG. 12. As the deposition continues, the nonconformal characteristic of the deposition causes the shoulders 25 to grow thicker until at the narrow gap or opening 14a, they almost bridge together as shown in FIG. 12. With continued deposition in a nonconformal manner with a step coverage of not greater than 10 to 20%, the shoulders 25 of the narrow gap 14a finally bridge over and create a void 30 between the two conductive lines 12a and 12b and positioned essentially below the tops of the conductive lines as shown in FIG. 13. In this position, the void 30 will have the greatest impact on lowering the dielectric constant of the insulation between the conductive lines 12a and 12b on opposite sides of the narrow gap 14a.

As a specific example of the operating conditions for depositing the $SiO_2$ nonconformal layer 24, $SiH_4$ and $N_2O$ and nitrogen gas ($N_2$) are used in the commercially available multi-station parallel plate reactor. The $SiH_4$ flow rate is set at 200 sccm and the $N_2O/N_2$ flow rates are set to 6000 sccm and 3150 sccm, respectively. The chamber pressure of the reactor is 2.2 Torr and the wafer temperature is held at 400° C. A 1000 watts (W) or rf power at 13.5 MHz is applied to the multiple top electrodes/gas showerheads. The power density is approximately 0.5 $W/cm^2$. Under these conditions, a $SiO_2$ deposition rate of 4500 Å/min is achieved.

Figure 14:
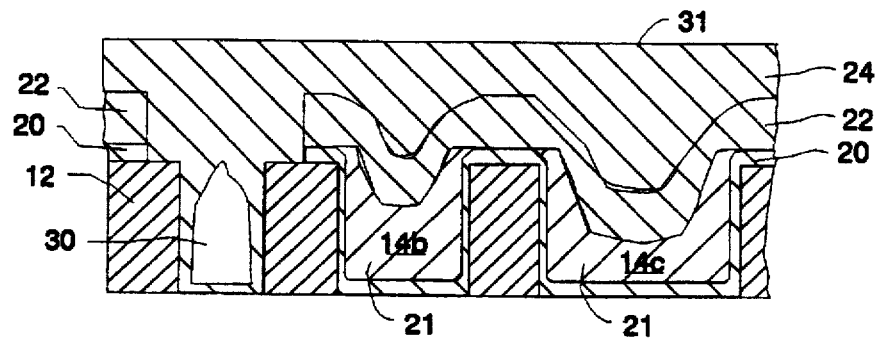
FIGS. 14, 15, 16, and 17 are enlarged cross-sectional views of the same section of FIG. 2 as in FIG. 3 showing early, intermediate and final stages of another embodiment of the present invention.

To provide a planarized layer of a combined insulating thickness of 0.8 to 1.2 microns for the next level of conductive lines (not shown), either a conformal insulating layer (not shown) is deposited on the layer 24, which comprises plasma enhanced $SiO_2$ and is deposited using TEOS in the parallel plate reactor, or the nonconformal insulating layer is deposited beyond the desired total insulation thickness of 0.8 to 1.0 microns. The surface 31 of this uppermost layer is chem/mech polished using commerically available equipment and slurry to planarize the its surface as shown in FIG. 14.

Figure 15:
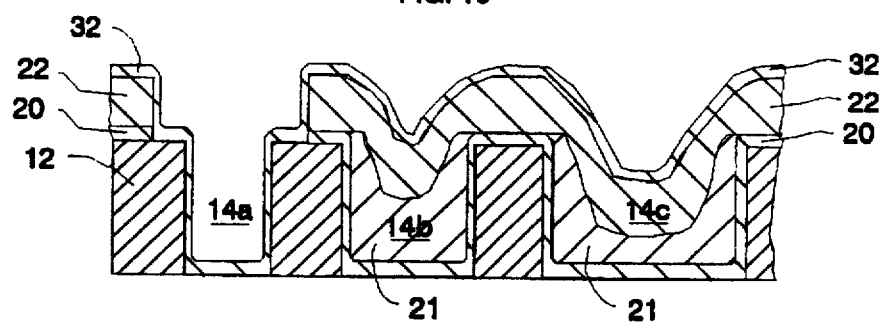
Figure 16:
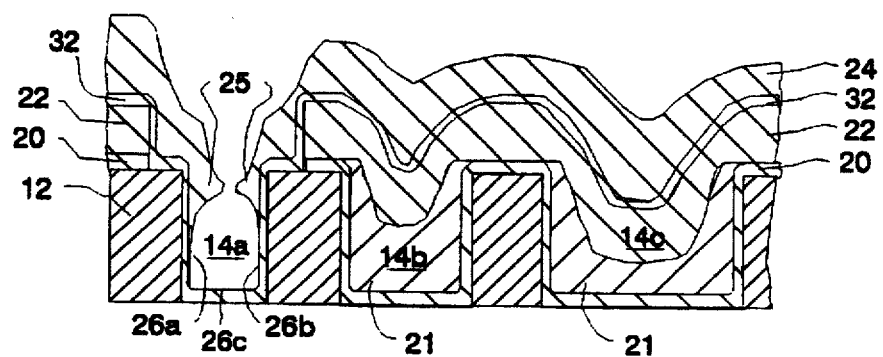
Figure 17:
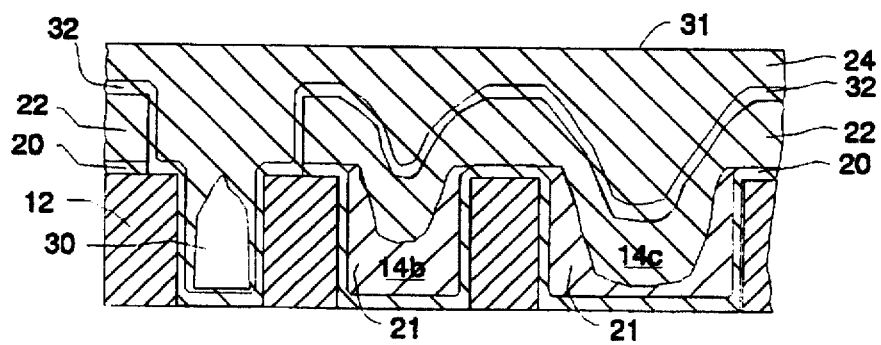

In accordance with another aspect of the present invention, a thin conformal insulating layer 32 of about 500 Å is first deposited in the narrow gap 14a as a safeguard against hillocks or protrusions from the metal conductive lines when the metal is aluminum (Al) as shown in FIG. 15. This conformal insulating liner 32 is deposited with the same materials and conditions as was conformal layer 20 except that its thickness is limited to 500°. The nonconformal deposition of the nonconformal insulating layer 24 then is the same as without the conformal liner 32, except that the initial deposition conditions can be modified so that the deposition results in even a poorer step coverage since sidewall protection is no longer necessary. After the deposition is sufficient to create a protective thickness of nonconformal insulating material 24 over the void 30, the surface 31 of the uppermost insulating layer is planarized by chem/mech polishing to give a combined thickness of insulation above the conductive lines 12 of between 0.8 and 1.0 microns as shown in FIG. 17.

Although this invention has been described relative to specific insulating materials, conductive materials and apparatuses for depositing and removing these materials, it is not limited to the specific materials but only to their specific characteristics, such as conformal and nonconformal, and other materials apparatuses can be substituted as is well understood by those skilled in the microelectronics arts after appreciating the present invention.

We claim:

1. An integrated circuit semiconductor device having a semiconductor body with a plurality of active devices and multilevel interconnections disposed on the semiconductor body comprising:

at least one interconnection level having at least one pair of conductive lines with opposing walls separated by a narrow space of not greater than 0.5 micron and each wall of the pair having a top at a height to establish an aspect ratio of not less than 2 to 1 relative to said narrow space;

additional pairs of conductive lines each having opposing walls separated by a space greater than 0.5 micron and each of walls having a top planar with the top of the walls of said one pair;

a solid nonconformal insulating material having a dielectric constant of not greater than 4 and being disposed over the top of and along each of the opposing walls of said one pair of conductive lines and bridging the narrow space to enclose, in the narrow space, a void comprising a gaseous insulating material having a dielectric constant of slightly greater than 1, the void in the narrow space being of such a size that the resultant dielectric constant of the combined solid insulating material and the gaseous insulating material in the narrow space is less than 3, said nonconformal insulating material being disposed over the tops of the opposing walls and at least partially in the spaces between the additional pairs of conductive lines.

2. The integrated circuit semiconductor device of claim 1 wherein a thin layer of solid conformal insulating material having a dielectric constant of not greater than 4 and being not greater than 500 Å in thickness is disposed on each of the opposing walls of the conductive lines and is between the wall and the solid nonconformal insulating material.

3. The integrated circuit semiconductor device of claim 1 wherein the size of the void in the narrow space is at least one-third the volume in the narrow space.

4. The integrated circuit semiconductor device of claim 1 wherein a spin on glass is disposed on the solid nonconformal insulating material in the spaces between the opposing walls of the additional pairs of conductive lines.

5. The integrated circuit semiconductor device of claim 4 wherein the spin on glass is a siloxane.

6. The integrated circuit semiconductor device of claim 1 wherein the conductive line is at least one of the group of aluminum and aluminum alloy.

7. The integrated circuit semiconductor device of claim 4 wherein a conformal insulating material having a dielectric constant of not greater than 4 and being not greater than 500 Å in thickness is disposed on the spin on glass.

8. In an integrated circuit semiconductor device having a semiconductor body with a plurality of active devices and multilevel interconnections disposed on the semiconductor body, at least one interconnection level having at least one pair of conductive lines with opposing walls separated by a narrow space of not greater than 0.5 micron and each wall of the pair having a top at a height to establish an aspect ratio of not less than 2 to 1 relative to said narrow space, additional pairs of conductive lines each having opposing walls separated by a space greater than 0.5 micron and each of the walls having a top planar with the top of the walls of said one pair, comprising:

a nonconformal insulating material having a dielectric constant of not greater than 4 and being disposed over the top of and along each of the opposing walls of said one pair of conductive lines and bridging the narrow space to enclose, in the narrow space, a void comprising a gaseous insulating material having a dielectric constant of slightly greater than 1, the void the narrow space being of such a size that the resultant dielectric constant of the combined nonconformal insulating material and the gaseous insulating material in the narrow space is less than 3, said nonconformal insulating material being disposed over the tops of the opposing walls and at least partially in the spaces between the additional pairs of conductive lines.

9. The integrated circuit semiconductor device of claim 8 wherein a thin layer of conformal insulating material having a dielectric constant of not greater than 4 and being not greater than 500 Å in thickness is disposed on each of the opposing walls of the conductive lines and is between the wall and the nonconformal insulating material.

10. The integrated circuit semiconductor device of claim 8 wherein the size of the void in the narrow space is at least one-third the volume in the narrow space.

11. The integrated circuit semiconductor device of claim 8 wherein a spin on glass is disposed on the nonconformal insulating material in the spaces between the opposing walls of the additional pairs of conductive lines.

12. The integrated circuit semiconductor device of claim 11 wherein the spin on glass is a siloxane.

13. The integrated circuit semiconductor device of claim 8 wherein the conductive line is at least one of the group of aluminum and aluminum alloy.

14. The integrated circuit semiconductor device of claim 11 wherein a conformal insulating material having a dielectric constant of not greater than 4 and being not greater than 500 Å in thickness is disposed on the spin on glass.

* * * * *